United States Patent
Takayama et al.

(10) Patent No.: US 7,633,213 B2
(45) Date of Patent: Dec. 15, 2009

(54) ACTUATOR, SWITCH USING THE ACTUATOR, AND METHOD OF CONTROLLING THE ACTUATOR

(75) Inventors: Ryouichi Takayama, Osaka (JP); Tetsuhiro Korechika, Osaka (JP); Koji Nomura, Nara (JP); Mitsuhiro Furukawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 595 days.

(21) Appl. No.: 11/415,076

(22) Filed: May 2, 2006

(65) Prior Publication Data

US 2006/0208612 A1 Sep. 21, 2006

(51) Int. Cl.
*H01L 41/08* (2006.01)
(52) U.S. Cl. .................... 310/331; 310/309
(58) Field of Classification Search ................. 310/309, 310/328, 330–332, 351
See application file for complete search history.

(56) References Cited

U.S. PATENT DOCUMENTS

| | | | | |
|---|---|---|---|---|
| 4,620,123 A | * | 10/1986 | Farrall et al. | 310/331 |
| 5,666,258 A | * | 9/1997 | Gevatter et al. | 361/207 |
| 6,479,920 B1 | * | 11/2002 | Lal et al. | 310/309 |
| 6,483,056 B2 | * | 11/2002 | Hyman et al. | 200/181 |
| 6,504,118 B2 | * | 1/2003 | Hyman et al. | 200/181 |
| 6,700,309 B2 | * | 3/2004 | Dausch et al. | 310/330 |
| 7,098,577 B2 | * | 8/2006 | Mehta | 310/332 |
| 7,479,726 B2 | * | 1/2009 | Ohguro | 310/330 |
| 2004/0075366 A1 | * | 4/2004 | Mehta | 310/336 |
| 2005/0236935 A1 | * | 10/2005 | Ohmori et al. | 310/328 |
| 2007/0228887 A1 | * | 10/2007 | Nishigaki et al. | 310/332 |

FOREIGN PATENT DOCUMENTS

| | | | | |
|---|---|---|---|---|
| JP | | 02-196989 A | * | 8/1990 |
| JP | | 04-238213 | * | 8/1992 |
| JP | | 2000-188050 | | 7/2000 |
| JP | | 2005-302711 A | * | 10/2005 |
| JP | | 2006-294866 | * | 10/2006 |
| WO | PCT/GB2004/003711 | | * | 9/2004 |

* cited by examiner

*Primary Examiner*—Thomas M Dougherty
(74) *Attorney, Agent, or Firm*—Wenderoth, Lind & Ponack, L.L.P.

(57) ABSTRACT

An actuator includes a base, an arm having an elastic property and supported by the base, electrostatic-driving electrodes provided on the base and the arm, respectively, and a piezoelectric-driving layer. The piezoelectric-driving layer includes a first electrode layer on the arm, a piezoelectric layer on the first electrode layer, and a second electrode layer on the piezoelectric layer. This actuator can be driven quickly with a low voltage.

18 Claims, 6 Drawing Sheets

ACTUATOR, SWITCH USING THE ACTUATOR, AND METHOD OF CONTROLLING THE ACTUATOR

BACKGROUND OF THE INVENTION

1. Field of the Invention

The present invention relates an actuator for use in electronic devices, a method of controlling the actuator, and a switch including the actuator.

2. Related Art

A conventional actuator of a micro-electro-mechanical system (MEMS) is disclosed in Japanese Patent Laid-Open Publication No. 2000-188050. The actuator includes an arm having an elastic property, and is supported on a substrate. A positive voltage is applied to one of respective electrodes provided on the substrate and the arm, and a negative voltage is applied to the other of the electrodes, thereby producing an electrostatic force. This electrostatic force causes the arm to deform toward the substrate. A movable contact provided on the arm accordingly contacts a fixed contact provided on the substrate, thus allowing the actuator to operate as a switch.

In this actuator, the distance between the electrostatic electrodes becomes the largest at an initial position in which the arm is straight. In order to drive the arm at a high speed from the initial position, a large electrostatic force is required, thus requiring an increased voltage applied to the electrodes. The deforming arm returns by an elastic force after the electrostatic force is released, and a speed of return is limited.

Another conventional actuator includes an arm deforming by a piezoelectric drive. In this actuator, when a movable contact contacts a fixed contact, the arm may vibrate, accordingly generating a noise.

While being used as micro-switches, conventional actuators of MEMS have not be able to be used in a switch required to have a large driving speed, such as a switch for switching the connection of transmitting and receiving signals of a portable telephone.

SUMMARY OF THE INVENTION

An actuator includes a base, an arm having an elastic property and supported by the base, electrostatic-driving electrodes provided on the base and the arm, respectively, and a piezoelectric-driving layer. The piezoelectric-driving layer includes a first electrode layer on the arm, a piezoelectric layer on the first electrode layer, and a second electrode layer on the piezoelectric layer.

This actuator can be driven quickly with a low voltage.

DETAILED DESCRIPTION OF THE INVENTION

Figure 1:
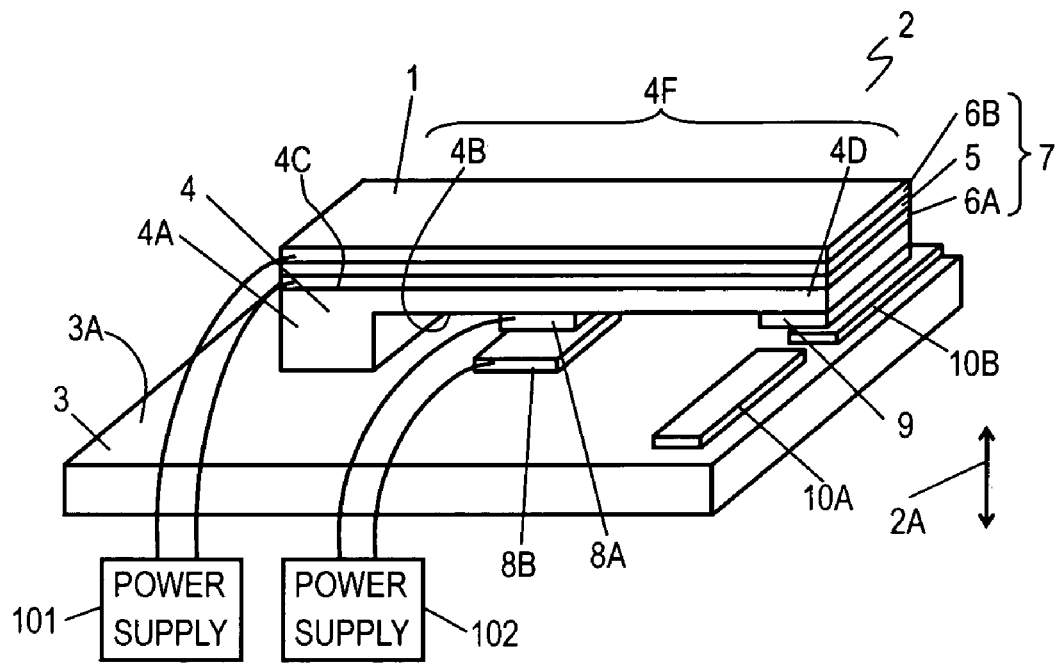
FIG. 1 is a perspective view of a switch including an actuator according to an exemplary embodiment of the present invention.

FIG. 1 is a perspective view of switch 2 including actuator 1 in accordance with an exemplary embodiment of the present invention. Actuator 1 includes base 3, arm 4, piezoelectric-driving layer 7, and electrostatic-driving electrodes 8A and 8B. Switch 2 includes actuator 1, and contacts 9, 10A, and 10B. Base 3 has surface 3A having an insulating property. Arm 4 has end 4A, a supported portion supported by base 3, and extends parallel to surface 3A of base 3. Arm 4 has a plate shape and has an elastic property. Arm 4 has surface 4B facing surface 3A of base 3, and has surface 4C opposite to surface 4B. Piezoelectric-driving layer 7 includes electrode layer 6A provided on surface 4C of arm 4, piezoelectric layer 5 provided on electrode layer 6A, and electrode layer 6B provided on piezoelectric layer 5. Electrostatic-driving electrode 8A is provided on surface 3A of base 3. Electrostatic-driving electrode 8B is provided on surface 4B of arm 4 and faces electrostatic-driving electrode 8A. Power supply 101 applies a direct-current (DC) voltage between electrode layers 6A and 6B of piezoelectric-driving layer 7. Power supply 102 applies a voltage between electrostatic-driving electrodes 8A and 8B. Contact 9 is provided on surface 4B at end 4D of arm 4. Contacts 10A and 10B are provided on surface 3A of base 3 and face contact 9. Arm 4 has movable portion 4F including end 4D different from end 4A supported by base 3.

Base 3 and arm 4 are made of silicon, and may be made of elastic material having an insulating surface, such as a metal having a surface to which an insulating process is performed.

An operation of switch 2 will be described below. Power supply 102 applies a DC voltage between electrostatic-driving electrodes 8A and 8B so as to produce an electrostatic force between electrostatic-driving electrodes 8A and 8B facing each other, thereby causing arm 4 to deform toward base 3. Further, power supply 101 applies a voltage between electrode layers 6A and 6B of piezoelectric-driving layer 7 to cause piezoelectric layer 5 to shrink and expand, thereby causing arm 4 to deform in direction 2A perpendicular to surface 3A of base 3. Arm 4 deforming toward surface 3A of base 3 causes contact 9 provided at end 4D to contact contacts 10A and 10B, thereby connecting contact 10A electrically with contact 10B.

In order to cause arm 4 to deform from initial position S1 at which no voltage is applied between electrode layers 6A and 6B and between electrostatic-driving electrodes 8A and 8B, power supply 102 needs to apply a high voltage between electrostatic-driving electrodes 8A and 8B. In switch 2, power supply 101 applies a voltage between electrode layers 6A and 6B of piezoelectric-driving layer 7 to cause arm 4 to deform toward surface 3A of base 3. That is, within range D1 from initial position S1 to position S2 at which arm 4 deforms, a force toward surface 3A produced by piezoelectric-driving layer 7 mainly causes arm 4 to deform, while the electrostatic force produced by electrostatic-driving electrodes 8A and 8B is smaller than the force produced by piezoelectric-driving layer 7. Then, arm 4 further deforms from position S2 to position S3 for allowing contact 9 to contact contacts 10A and 10B. Position S2 is closer to position S3, i.e., surface 3A of base 3, than initial position S1 is. Within range D2 from position S2 to position S3, the electrostatic force produced by electrostatic-driving electrodes 8A and 8B causes arm 4 to deform in addition to the force produced by piezoelectric-driving layer 7. In order to cause arm 4 to deform further within range D2, the electrostatic force produced between electrostatic-driving electrodes 8A and 8B mainly works, while the force produced by piezoelectric driving layer 7 is smaller than the electrostatic force produced by electrostatic-driving electrodes 8A and 8B. The distance between electrostatic-driving electrodes 8A and 8B at position S2 is shorter than that at initial position S1, accordingly allowing the voltage applied between electrostatic-driving electrodes 8A and 8B to be small. This allows arm 4 to deform quickly, and further decreases the voltage applied between electrostatic-driving electrodes 8A and 8B, thus allowing switch 2 to be used in devices, such as portable telephones, requiring operation at a low voltage.

If arm 4 deforms only with the force of piezoelectric-driving layer 7, the elastic property of arm 4 may cause arm 4 to vibrate. In switch 2, the electrostatic force increases as electrostatic-driving electrode 8A and 8B get close to each other, and suppresses the vibration of arm 4, thereby reducing a noise. When arm 4 is kept at position S3, the electrostatic force produced between electrostatic-driving electrodes 8A and 8B mainly keeps arm 4 at position S3, while the force produced by piezoelectric layer 7 is smaller than the electrostatic force produced between electrostatic-driving electrodes 8A and 8B.

When arm 4 deforms only with the electrostatic force between electrostatic-driving electrodes 8A and 8B, arm 4 returns to initial position S1 only by the elastic property of arm 4 after the deforming of arm 4. This operation limits a speed at which arm 4 returns to initial position S1. In switch 2 of the embodiment, power supply 101 applies a voltage having a reverse polarity between electrode layers 6A and 6B of piezoelectric-driving layer 7 to cause arm 4 to receive a force away from surface 3A of base 3, thereby allowing arm 4 to return to initial position S1 quickly.

Figure 2:
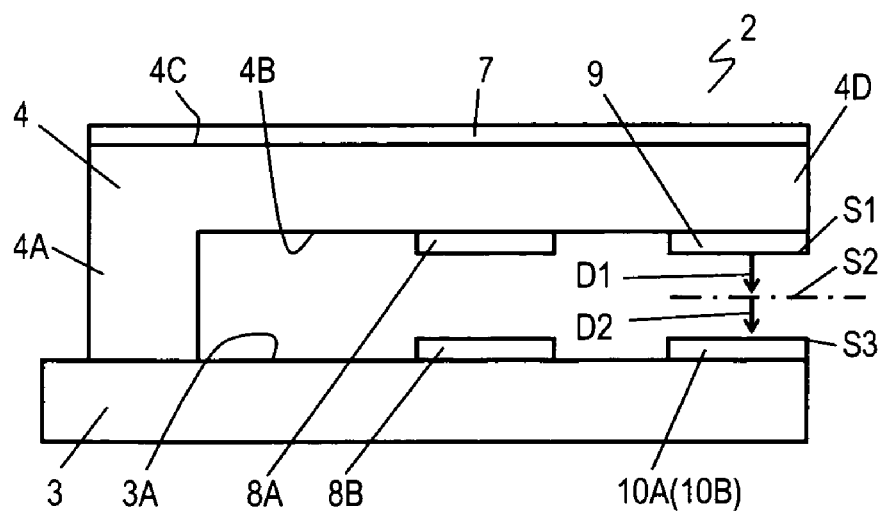
FIG. 2 is a side view of the switch according to the embodiment.
Figure 3:
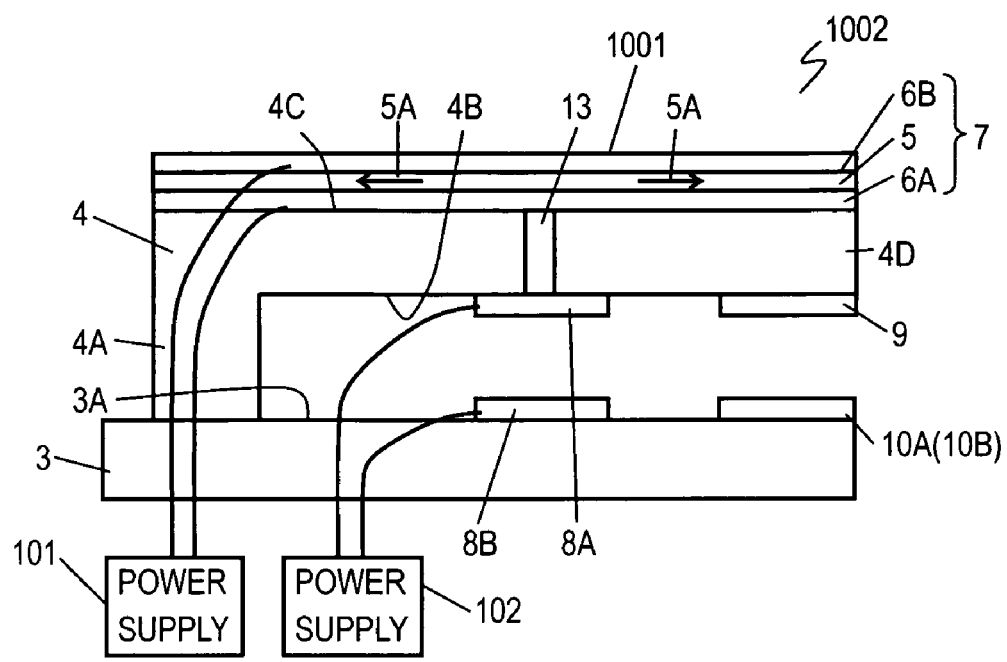
FIG. 3 is a side view of another switch according to the embodiment.

FIG. 3 is a side view of switch 1002 including another actuator 1001 of the embodiment. In FIG. 3, components of switch 2 shown in FIGS. 1 and 2 are denoted by the same reference numerals, and their descriptions are omitted. Actuator 1001 further includes via-conductor 13 for electrically connecting electrostatic-driving electrode 8A on arm 4 with electrode layer 6A of piezoelectric-driving layer 7. Thus, electrostatic-driving electrode 8A and piezoelectric-driving layer 7 are provided with electric potentials identical to each other. Via-conductor 13 penetrates between surface 4B and surface 4C of arm 4. Electrostatic-driving electrode 8B on surface 3A of base 3 is grounded. Piezoelectric layer 5 is polarized so as to expand in surface direction 5A when an electric field from electrode layer 6A to electrode layer 6B is applied to piezoelectric layer 5. Power supply 102 applies a positive voltage to electrode layer 6A, and electrode layer 6B is grounded so as to expand piezoelectric layer 5, accordingly causing arm 4 to deform toward surface 3A of base 3. At this moment, electrostatic-driving electrodes 8A and 8B attract each other, thereby causing contact 9 provided at end 4D of arm 4 to contact contacts 10A and 10B and electrically connecting contact 10A with contact 10B. Then, electrode layer 6A and electrostatic-driving electrode 8A are grounded, and power supply 101 applies a positive voltage to electrode layer 6B. Electrostatic-driving electrode 8B is grounded, thereby eliminating the electrostatic force causing electrostatic-driving electrodes 8A and 8B to attract each other. Further, a shrinking force of piezoelectric layer 5 and the elastic property of arm 4 cause end 4D of arm 4 to move away from surface 3A, thus disconnecting contact 10A from contact 10B.

In switch 1002, a positive voltage and a zero potential (grounding) are applied alternately between (a) electrode layer 6A and electrostatic-driving electrode 8A and (b) electrode layer 6B so as to cause arm 4 deform and return. When arm 4 deforms toward surface 3A, the respective forces produced by piezoelectric-driving layer 7 and electrostatic-driving electrodes 8A and 8B are used. When deforming arm 4 moves away from surface 3A to return, the respective forces produced by piezoelectric-driving layer 7 and the elastic property of arm 4 are used. This operation allows actuator 1001 to activate switch 1002 quickly with low voltages.

Figure 4:
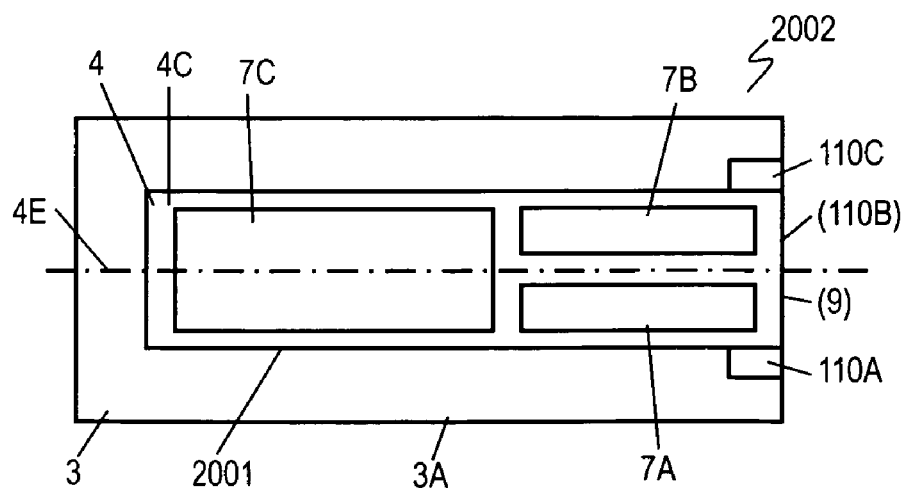
FIG. 4 is a top view of still another switch according to the embodiment.
Figure 5A:
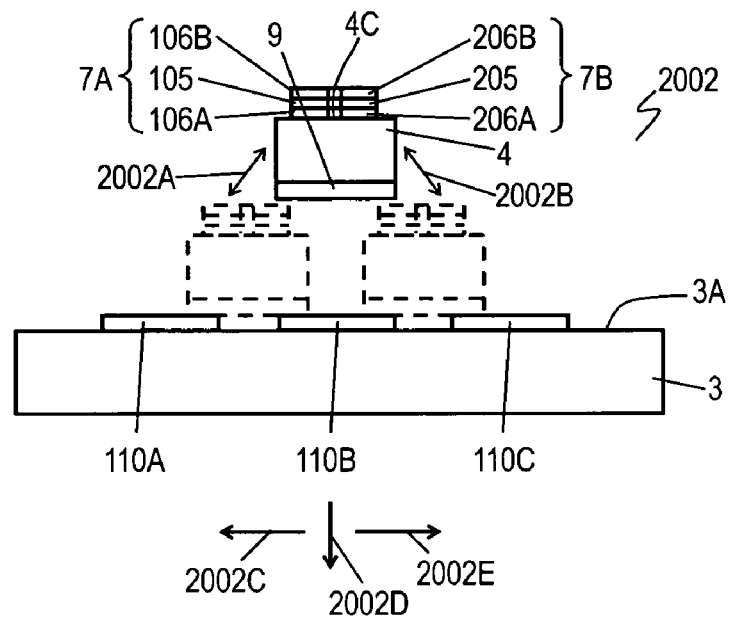
FIG. 5A is a front view of the switch shown in FIG. 4.
Figure 5B:
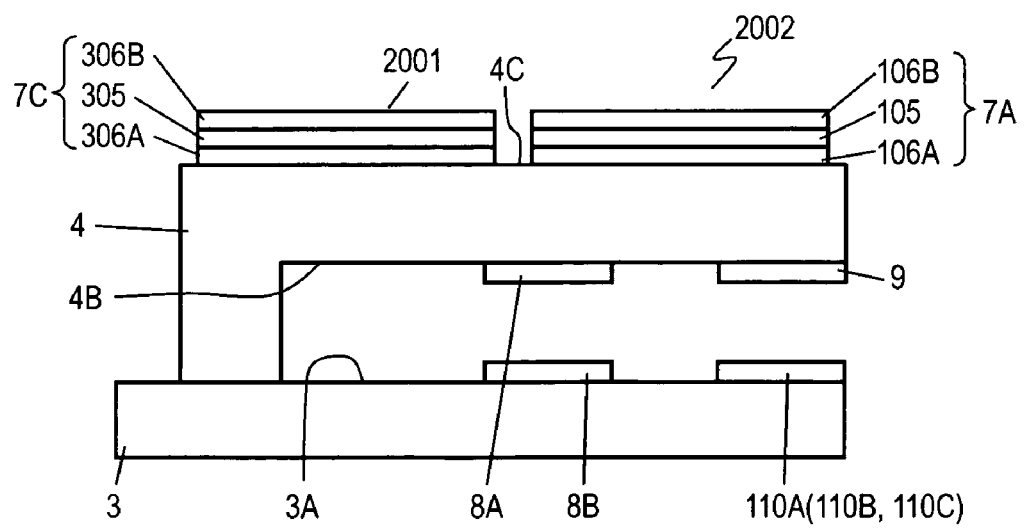
FIG. 5B is a side view of the switch shown in FIG. 4.

FIG. 4 is a top view of switch 2002 including still another actuator 2001 of the embodiment. FIGS. 5A and 5B are a front view and a side view of switch 2002, respectively. In FIGS. 4, 5A and 5B, components identical to those of switch 2 shown in FIGS. 1 and 2 are denoted by the same reference numerals, and their descriptions are omitted. Instead of piezoelectric-driving layer 7 of actuator 1 shown in FIGS. 1 and 2, actuator 2001 includes piezoelectric-driving layers 7A, 7B, and 7C. Instead of contacts 10A and 10B of switch 2 shown in FIGS. 1 and 2, switch 2002 includes contacts 110A, 110B, and 110C provided on surface 3A, As shown in FIGS. 5A and 5B, piezoelectric-driving layer 7A includes electrode layer 106A provided on surface 4C of arm 4, piezoelectric layer 105 provided on electrode layer 106A, and electrode layer 106B provided on piezoelectric layer 105. Piezoelectric-driving layer 7B includes electrode layer 206A provided on surface 4C of arm 4, piezoelectric layer 205 provided on electrode layer 206A, and electrode layer 206B provided on piezoelectric layer 205. Piezoelectric-driving layer 7C includes electrode layer 306A provided on surface 4C of arm 4, piezoelectric layer 305 provided on electrode layer 306A, and electrode layer 306B provided on piezoelectric layer 305. At an initial position at which no voltage is applied to the electrostatic-driving electrodes and the electrode layers, contact 110B is located beneath contact 9 and faces contact 110B.

As shown in FIG. 4, piezoelectric-driving layers 7A and 7B are provided at positions symmetric with each other about axis 4E passing through supported end 4A of arm 4 and end 4D having contact 9 thereon. Contact 110B is provided between contacts 110A and 110C.

An operation of actuator 2001 and switch 2002 will be described below. A voltage is not applied between electrode layers 106A and 106B of piezoelectric-driving layer 7A, while voltages are applied between electrode layers 206A and 206B of piezoelectric-driving layer 7B, between electrode layers 306A and 306B of piezoelectric-driving layer 7C, and between electrostatic-driving electrodes 8A and 8B. Then, a force in direction 2002C produced by piezoelectric-driving layer 7C, a force in direction 2002D produced by piezoelectric-driving layer 7B, and an electrostatic force produced by electrostatic-driving electrodes 8A and 8B work together. These forces cause arm 4 to deform in direction 2002A shown in FIG. 5A, and cause contact 9 to contact contacts 110A and 110B, thereby electrically connecting contact 110A with contact 110B. Then, the voltage applied between electrostatic-driving electrodes 8A and 8B is changed into zero, the polarities of the voltages applied between electrode layers 206A and 206B and between electrode layers 306A and 306B are reversed. This operation allows forces to be produced by piezoelectric-driving layers 7B and 7C and the elastic property of arm 4 to cause arm 4 to return to the initial position, thereby electrically disconnecting contact 110A from contact 110B. Similarly, a voltage is not applied between electrode layers 206A and 206B of piezoelectric-driving layer 7B while voltages are applied between electrode layers 106A and 106B of piezoelectric-driving layer 7A, between electrode layers 306A and 306B of piezoelectric-driving layer 7C, and between electrostatic-driving electrodes 8A and 8B. Then, a force in direction 2002C produced by piezoelectric-driving layer 7C, a force in direction 2002E produced by piezoelectric-driving layer 7B, and the electrostatic force produced by electrostatic-driving electrodes 8A and 8B are applied to arm 4. These forces cause arm 4 to deform in direction 2002B shown in FIG. 5A, and cause contact 9 to contact contacts 110B and 110C, thereby electrically connecting contact 110B with contact 110C. Then, the voltage applied between electrostatic-driving electrodes 8A and 8B is changed to zero, and the polarities of the voltages applied between electrode layers 106A and 106B and between electrode layers 306A and 306B are reversed. This operation allows forces to be produced by piezoelectric-driving layers 7A and 7C and the elastic property of arm 4 to cause arm 4 to return to the initial position, thereby disconnecting contact 110B from contact 110C.

Switch 2002 can be used as a single-pole double-throw (SPDT) switch for use in dual-band portable telephones operating in two different transmitting/receiving systems, such as a global system for mobile communication (GSM) system and a digital communication service (DCS) in European portable telephone communication systems. Contact 1110B may be used as an antenna terminal, contact 110A may be used as a transmitting terminal, and contact 110C may be used as a receiving terminal. The contacts switch a single antenna to connect the antenna selectively with transmitting and receiving circuits.

For use in such high-frequency circuits, switch 2002 is required to have an isolation between contacts 110A, 110B, and 110C when these contacts do not contact one another. An inductor may be connected in parallel with a parasitic capacitance between the contacts to provide the isolation, and a parallel resonance frequency of them is determined to be a frequency band requiring the isolation.

The positions of the contacts and switches may be arranged appropriately, thereby allowing the switch of this embodiment to be used as a switch supporting multi-bands, such as a single-pole three-throw (SP3T) switch and a double-pole double-throw (DPDT) switch.

In each of actuators 1, 1001, and 2001 of the embodiment, arm 4 is supported by base 3 at end 4A. However, arm 4 may be supported at both ends, providing the same effects.

Figure 6:
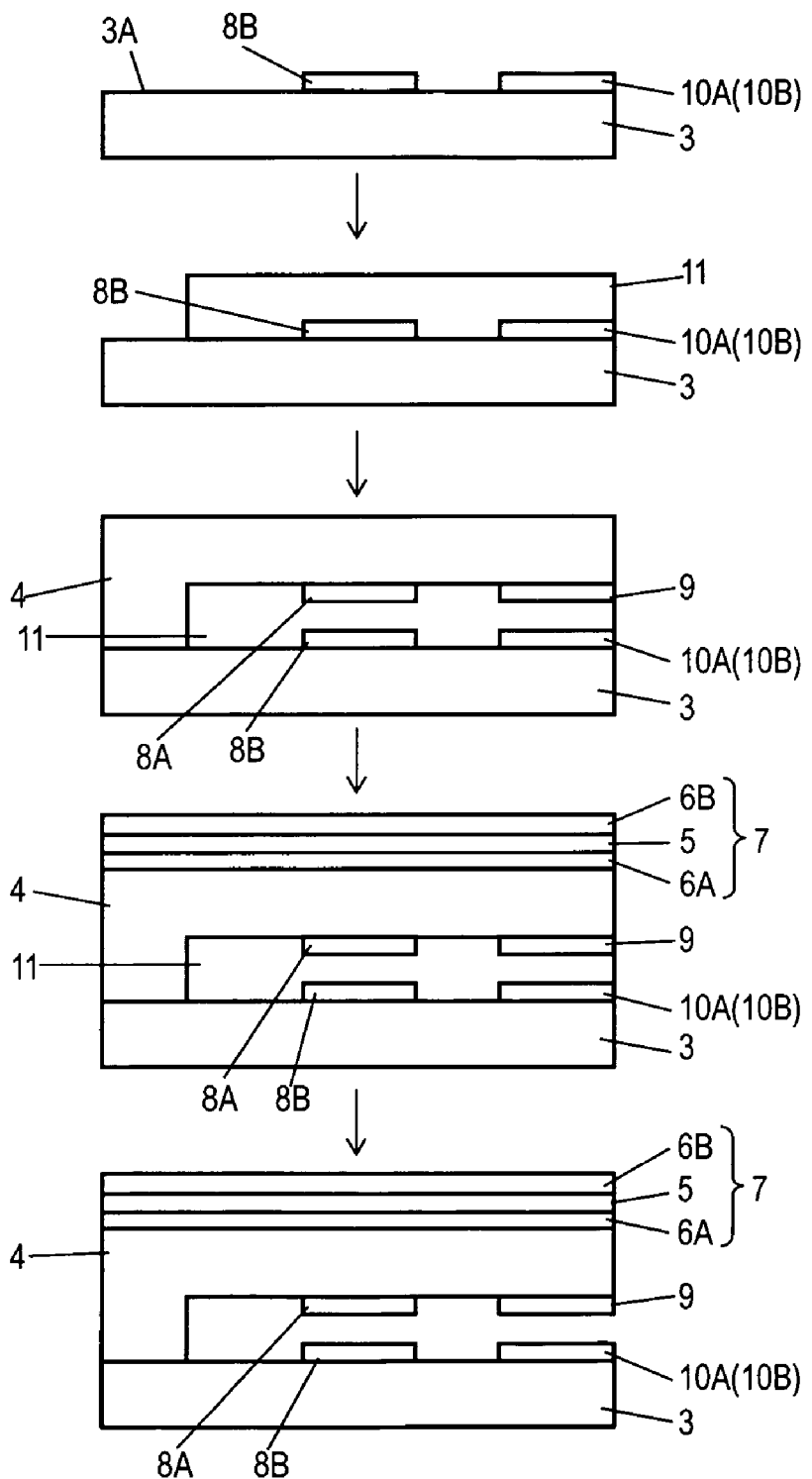
FIG. 6 is a side view of the switch for illustrating a method of manufacturing the switch according to the embodiment.

Then, a method of manufacturing switch 2 will be described below. FIG. 6 is a side view of switch 2 for illustrating a method of manufacturing switch 2. Electrostatic-driving electrode 8B and contacts 10A and 10B are formed by sputtering on surface 3A of base 3 made of silicon. Then, electrostatic-driving electrode 8A and contact 9 are formed on dummy layer 11 made of silicon dioxide. Then, dummy layer 11 is mounted on surface 3A and contacts 10A and 10B except portion 3B of surface 3A supporting end 4A of arm 4. Arm 4 made of silicon is formed on electrostatic-driving electrode 8A, contact 9, dummy layer 11, and portion 3B of surface 3A. Then, electrode layer 6A, piezoelectric layer 5 made of lead zirconate titanate (PZT), and electrode layer 6B are formed on arm 4, thus forming piezoelectric-driving layer 7 on arm 4. Then, dummy layer 11 is removed, providing switch 2.

Figure 7:
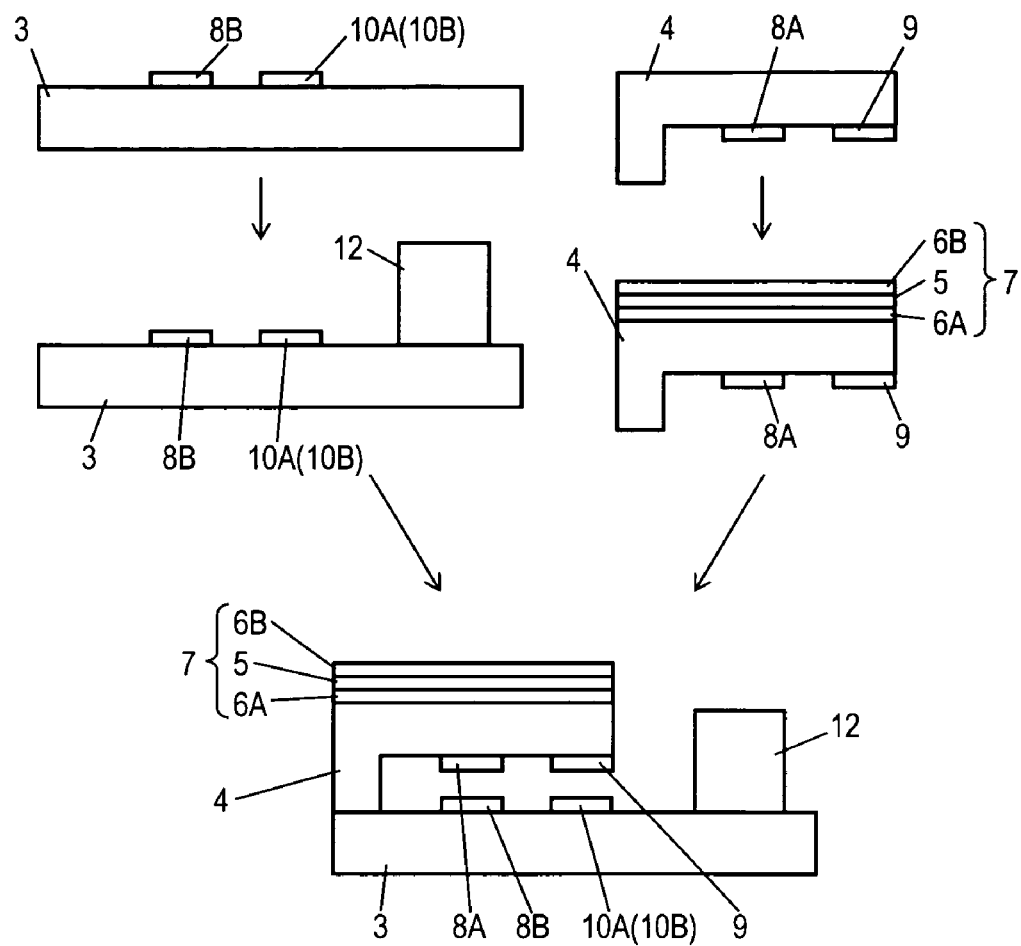
FIG. 7 is a side view of the switch for illustrating another method of the manufacturing the switch according to the embodiment.

FIG. 7 is a side view of switch 2 for illustrating another method of manufacturing switch 2. Device 12 can be mounted on switch 2. When piezoelectric layer 5 of PZT is formed, switch 2 is heat-treated at temperatures of about 600° C. Device 12, being a device having small heat resistance, such as a surface acoustic wave (SAW) filter, may be broken due to the heat treatment. As shown in FIG. 7, piezoelectric-driving layer 7 including piezoelectric layer 5 and arm 4 are formed together, and device 12 is mounted on base 3 separately from piezoelectric-driving layer 7 and arm 4. Then, arm 4 is mounted on base 3. Thus, device 12 having a small heat resistance can be combined with switch 2 including piezoelectric layer 5.

Figure 8:
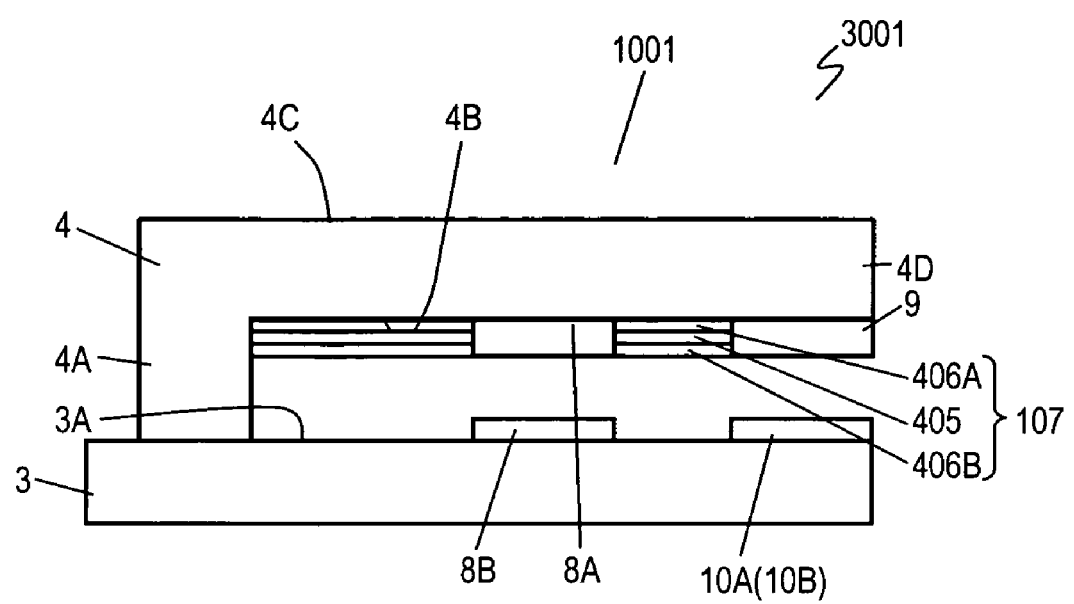
FIG. 8 is a side view of still another switch according to the embodiment.

FIG. 8 is a side view of switch 3002 including still another actuator 3001 according to the embodiment. In FIG. 8, components identical to those of switch 2 shown in of FIGS. 1 and 2 are denoted by the same reference numerals, and their descriptions are omitted. Instead of piezoelectric-driving layer 7 of actuator 1 shown in FIG. 1, actuator 3001 includes piezoelectric-driving layer 107 provided on surface 4B. Piezoelectric-driving layer 107 includes electrode layer 406A provided on surface 4B, piezoelectric layer 405 provided on electrode layer 406A, and electrode layer 406B provided on piezoelectric layer 405. Piezoelectric-driving layer 107, electrostatic-driving electrode 8A, and contact 9 are provided on a single surface, surface 4B of arm 4, hence being formed at a high productivity.

What is claimed is:

1. An actuator comprising:
   a base having an insulating surface;
   an elastic arm, the arm including:
      a supported portion supported by the base;
      a movable portion;
      a first surface on the movable portion of the arm facing the surface of the base; and
      a second surface on a side of the movable portion of the arm opposite to the first surface;
   a first electrostatic-driving electrode provided on the base and facing the arm;
   a second electrostatic-driving electrode provided at the movable portion of the arm and on the first surface, the second electrostatic-driving electrode facing the first electrostatic-driving electrode;
   a first piezoelectric-driving layer disposed on the second surface of the arm, the first piezoelectric-driving layer including:
      a first electrode layer provided on the second surface of the arm;
      a first piezoelectric layer provided on the first electrode layer; and
      a second electrode layer provided on the first piezoelectric layer; and
   a second piezoelectric-driving layer disposed on the second surface of the arm, the second piezoelectric-driving layer including:
      a third electrode layer provided on the second surface of the arm;
      a second piezoelectric layer provided on the third electrode layer; and
      a fourth electrode layer provided on the second piezoelectric layer,
   wherein the arm has an axis passing through the supporting portion and the movable portion, and
   wherein the first piezoelectric-driving layer and the second piezoelectric-driving layer are provided at positions symmetric with each other about the axis.

2. The actuator of claim 1, further comprising a conductor for electrically connecting the first electrode layer of the first piezoelectric-driving layer with the second electrostatic-driving electrode.

3. The actuator of claim 2, wherein the conductor comprises a via-conductor penetrating through the arm.

4. An actuator comprising:
   a base having an insulating surface;

an elastic arm, the arm including:
- a supported portion supported by the base;
- a movable portion;
- a first surface on the movable portion of the arm facing the surface of the base; and
- a second surface on a side of the movable portion of the arm opposite to the first surface;

a first electrostatic-driving electrode provided on the base and facing the arm;

a second electrostatic-driving electrode provided at the movable portion of the arm and on the first surface, the second electrostatic-driving electrode facing the first electrostatic-driving electrode;

a first piezoelectric-driving layer disposed on the first surface of the arm, the first piezoelectric-driving layer including:
- a first electrode layer provided on the first surface of the arm;
- a first piezoelectric layer provided on the first electrode layer; and
- a second electrode layer provided on the first piezoelectric layer; and a second piezoelectric-driving layer disposed on the first surface of the arm, the second piezoelectric-driving layer including:
- a third electrode layer provided on the first surface of the arm;
- a second piezoelectric layer provided on the third electrode layer; and
- a fourth electrode layer provided on the second piezoelectric layer, wherein the arm has an axis passing through the supporting portion and the movable portion, and wherein the first piezoelectric-driving layer and the second piezoelectric-driving layer are provided at positions symmetric with each other about the axis.

5. A method of controlling an actuator, the method comprising:
providing an actuator including:
- a base having an insulating surface;
- an elastic arm, the arm including:
  - a supported portion supported by the base;
  - a movable portion;
  - a first surface on the movable portion of the arm facing the surface of the base; and
  - a second surface on a side of the movable portion of the arm opposite to the first surface;
- a first electrostatic-driving electrode provided on the base and facing the arm;
- a second electrostatic-driving electrode provided at the movable portion of the arm and on the first surface, the second electrostatic-driving electrode facing the first electrostatic-driving electrode;
- a first piezoelectric-driving layer disposed on the second surface of the arm, the first piezoelectric-driving layer including:
  - a first electrode layer provided on the second surface of the arm;
  - a first piezoelectric layer provided on the first electrode layer; and
  - a second electrode layer provided on the piezoelectric layer; and
- a second piezoelectric-driving layer disposed on the second surface of the arm, the second piezoelectric-driving layer including:
  - a third electrode layer provided on the second surface of the arm;
  - a second piezoelectric layer provided on the third electrode layer; and
  - a fourth electrode layer provided on the second piezoelectric layer, wherein the arm has an axis passing through the supporting portion and the movable portion, and wherein the first piezoelectric-driving layer and the second piezoelectric-driving layer are provided at positions symmetric with each other about the axis;

causing the arm to deform in a first direction toward the surface of the base from an initial position to a first position; and causing the arm to deform further in the first direction from the first position to a second position which is closer to the surface of the base than the first position is.

6. The method of claim 5, wherein said causing the arm to deform from the initial position to the first position comprises:
- causing the first piezoelectric-driving layer to produce a force by applying a voltage between the first electrode layer and the second electrode layer;
- producing an electrostatic force between the first electrostatic-driving electrode and the second electrostatic-driving electrode by applying a voltage between the first electrostatic-driving electrode and the second electrostatic-driving electrode; and
- causing the arm to deform with the electrostatic force and the force produced by the piezoelectric-driving layer.

7. The method of claim 6, wherein the electrostatic force is smaller than the force produced by the first piezoelectric-driving layer during said causing the arm to deform from the initial position to the first position.

8. The method of claim 7, wherein
the first electrostatic-driving electrode is grounded,
the first electrode layer of the first piezoelectric-driving layer and the second electrostatic-driving electrode are provided with potentials identical to each other, and
said causing the arm to deform from the initial position to the first position comprises:
- applying a voltage to the first electrode layer; and
- grounding the second electrode layer.

9. The method of claim 5, wherein said causing the arm to deform further from the first position to the second position comprises:
- causing the first piezoelectric-driving layer to produce a force by applying a voltage between the first electrode layer and the second electrode layer;
- producing an electrostatic force between the first electrostatic-driving electrode and the second electrostatic-driving electrode by applying a voltage between the first electrostatic-driving electrode and the second electrostatic-driving electrode; and
- causing the arm to deform with the electrostatic force and the force produced by the first piezoelectric-driving layer.

10. The method of claim 9, wherein the force produced by the first piezoelectric-driving layer is smaller than the electrostatic force during said causing the arm to deform further from the first position to the second position.

11. The method of claim 5, further comprising
keeping the arm at the second position after said causing the arm to deform further from the first position to the second position.

12. The method of claim 11, wherein said keeping the arm at the second position comprises:

causing the first piezoelectric-driving layer to produce a force by applying a voltage between the first electrode layer and the second electrode layer;

producing an electrostatic force between the first electrostatic-driving electrode and the second electrostatic-driving electrode by applying a voltage between the first electrostatic-driving electrode and the second electrostatic-driving electrode; and keeping the arm at the second position with the electrostatic force and the force produced by the first piezoelectric-driving layer.

13. The method of claim 12, wherein the force produced by the piezoelectric-driving layer is smaller than the electrostatic force during said keeping the arm at the second position.

14. The method of claim 5, further comprising:

causing the first piezoelectric-driving layer to produce a force on the arm directed away from the surface of the base, and causing the arm to return from the second position to the initial position by the force produced by the causing the first piezoelectric-driving layer to produce a force.

15. The method of claim 14, wherein the first electrostatic-driving electrode is grounded, the first electrode layer of the first piezoelectric-driving layer and the second electrostatic-driving electrode are provided with potentials identical to each other, and said causing the first piezoelectric-driving layer to produce the force on the arm directed away from the surface of the base comprises:

grounding the first electrode layer; and applying a voltage to the second electrode layer.

16. A switch comprising:

a base having an insulating surface;

an elastic arm, the arm including:

a supported portion supported by the base;

a movable portion;

a first surface on the movable portion of the arm facing the surface of the base; and a second surface on a side of the movable portion of the arm opposite to the first surface;

a first electrostatic-driving electrode provided on the base and facing the arm;

a second electrostatic-driving electrode provided at the movable portion of the arm and on the first surface, the second electrostatic-driving electrode facing the first electrostatic-driving electrode;

a first piezoelectric-driving layer disposed on the second surface of the arm, the first piezoelectric-driving layer including:

a first electrode layer provided on the second surface of the arm;

a first piezoelectric layer provided on the first electrode layer; and a second electrode layer provided on the first piezoelectric layer;

a second piezoelectric-driving layer disposed on the second surface of the arm, the second piezoelectric-driving layer including:

a third electrode layer provided on the second surface of the arm;

a second piezoelectric layer provided on the third electrode layer; and a fourth electrode layer provided on the second piezoelectric layer;

a first contact; and a second contact configured to contact the first contact under deformation of the arm in a first direction toward the surface of the base.

17. The method of claim 5, further comprising:

causing the arm to deform in a second direction toward the surface of the base from an initial position to a third position, the second direction being different from the first direction; and causing the arm to deform further in the second direction from the third position to a fourth position which is closer to the surface of the base than the third position is.

18. The switch of claim 16, further comprising a third contact configured to contact the first contact under a deformation of the arm in a second direction toward the surface of the base, the second direction being different from the first direction.

* * * * *